(12) United States Patent
Tsuchimochi (10) Patent No.: US 10,777,488 B2
(45) Date of Patent: Sep. 15, 2020

(54) SEMICONDUCTOR DEVICE INCLUDING CONDUCTIVE SPACER WITH SMALL LINEAR COEFFICIENT

(71) Applicant: DENSO CORPORATION, Kariya-shi (JP)

(72) Inventor: Shingo Tsuchimochi, Nagakute (JP)

(73) Assignee: DENSO CORPORATION, Kariya-shi (JP)

( * ) Notice: Subject to any disclaimer, the term of this patent is extended or adjusted under 35 U.S.C. 154(b) by 0 days.

(21) Appl. No.: 16/146,340

(22) Filed: Sep. 28, 2018

(65) Prior Publication Data

US 2019/0103340 A1     Apr. 4, 2019

(30) Foreign Application Priority Data

Oct. 2, 2017    (JP) .................. 2017-192699

(51) Int. Cl.
*H01L 23/051*    (2006.01)
*H01L 23/31*    (2006.01)
(Continued)

(52) U.S. Cl.
CPC ........ *H01L 23/4924* (2013.01); *H01L 23/051* (2013.01); *H01L 23/3121* (2013.01); *H01L 24/32* (2013.01); *H01L 25/072* (2013.01); *H01L 24/83* (2013.01); *H01L 2224/32225* (2013.01); *H01L 2224/32245* (2013.01); *H01L 2224/33* (2013.01); *H01L 2224/33181* (2013.01); *H01L 2224/40245* (2013.01); *H01L 2224/48091* (2013.01); *H01L 2224/48247* (2013.01); *H01L 2224/73265* (2013.01); *H01L 2224/83447* (2013.01); *H01L 2224/83895* (2013.01); *H01L 2924/00014* (2013.01); *H01L 2924/1033* (2013.01); *H01L 2924/10253* (2013.01); *H01L 2924/10272* (2013.01); (Continued)

(58) Field of Classification Search
CPC ... H01L 23/4924; H01L 23/051; H01L 23/00; H01L 23/31; H01L 25/07
See application file for complete search history.

(56) References Cited

U.S. PATENT DOCUMENTS 10,002,821 B1 *   6/2018   Hoegerl ............ H01L 23/49844
2012/0218714 A1 * 8/2012   Robert .................. H01L 23/053
                                                                  361/713

FOREIGN PATENT DOCUMENTS

JP           2012-146760 A      8/2012

* cited by examiner

*Primary Examiner* — Allen L Parker
*Assistant Examiner* — Gustavo G Ramallo
(74) *Attorney, Agent, or Firm* — Hunton Andrews Kurth LLP (57) ABSTRACT

A semiconductor device is provided with a first insulated substrate including an insulator layer and a metal layer disposed on each of two faces of the insulator layer, a first semiconductor element disposed on the metal layer on one face of the first insulated substrate, a second insulated substrate including an insulator layer and a metal layer disposed on each of two faces of the insulator layer, a second semiconductor element disposed on one of the metal layers of the second insulated substrate, and an encapsulant encapsulating the first semiconductor element and the second semiconductor element. The metal layer on the other face of the first insulated substrate and the metal layer on the other face of the second insulated substrate are exposed on a first flat surface of the encapsulant.

6 Claims, 11 Drawing Sheets

(51) Int. Cl.
*H01L 23/492* (2006.01)
*H01L 23/00* (2006.01)
*H01L 25/07* (2006.01)

(52) U.S. Cl.
CPC .................. *H01L 2924/1203* (2013.01); *H01L 2924/13055* (2013.01); *H01L 2924/13091* (2013.01); *H01L 2924/181* (2013.01)

Cu : Large Thermal Expansion

Strain : Large

FIG. 8B

Cu-Mo : Small Thermal Expansion

Strain : Small

SEMICONDUCTOR DEVICE INCLUDING CONDUCTIVE SPACER WITH SMALL LINEAR COEFFICIENT

CROSS-REFERENCE

This application claims priority to Japanese patent application No. 2017-192699, filed on Oct. 2, 2017, the entire contents of which are incorporated herein by reference.

TECHNICAL FIELD

The technique disclosed herein relates to a semiconductor device.

BACKGROUND

Japanese Patent Application Publication No. 2012-146760 discloses a semiconductor device using an insulated substrate. The insulated substrate is a substrate mainly used in a circuit for a power system and has a structure in which a metal layer constituted of copper, aluminum, or the like is disposed on each of both faces of an insulator layer constituted of ceramic, for example. A semiconductor device includes the insulated substrate and a plurality of semiconductor elements mounted on the metal layer disposed on one face of the insulated substrate.

SUMMARY

In the insulated substrate, since the insulator layer and the metal layer have different linear expansion coefficients, thermal stress tends to occur therein, accompanied by a change in temperature. The thermal stress caused in the insulated substrate increases depending on a size of the insulated substrate. Thus, in order to suppress damage to the insulated substrate due to the thermal stress, it is proposed to downsize the insulated substrate. However, in the semiconductor device having a plurality of semiconductor elements, the size required for the insulated substrate inevitably increases depending on a number of semiconductor elements, which could also increase the thermal stress that occurs in the insulated substrate.

In view of the above circumstances, it is an object of the present disclosure herein to provide a technique capable of reducing thermal stress that occurs in an insulated substrate in a semiconductor device having a plurality of semiconductor elements.

To solve the above problems, a semiconductor device is disclosed herein. The semiconductor device may include: a first insulated substrate including an insulator layer and a metal layer disposed on each of two faces of the insulator layer; a first semiconductor element disposed on the metal layer on one face of the first insulated substrate; a second insulated substrate including an insulator layer and a metal layer disposed on each of two faces of the insulator layer; a second semiconductor element disposed on the metal layer on one face of the second insulated substrate; and an encapsulant encapsulating the first semiconductor element and the second semiconductor element. The metal layer on the other face of the first insulated substrate and the metal layer on the other face of the second insulated substrate may be exposed on a first flat surface of the encapsulant.

In the related art, a single insulated substrate is employed for a plurality of semiconductor elements. This is because in the insulated substrate, a pattern on a metal layer can be flexibly divided on an insulator layer, and thereby the insulated substrate itself does not need to be divided. However, the present technique employs a plurality of insulated substrates for a plurality of semiconductor elements. That is, in the above-mentioned semiconductor device, the first insulated substrate and the second insulated substrate are provided, the first semiconductor element is disposed on the first insulated substrate, and the second semiconductor element is disposed on the second insulated substrate. The first insulated substrate and the second insulated substrate are exposed on a same flat surface of the encapsulant. The first insulated substrate and the second insulated substrate that have such a positional relationship constitute the single insulated substrate used in the related art. Contrary to this, the present technique is designed to employ the plurality of insulated substrates to thereby downsize each of the insulated substrates, thus reducing the thermal stress that occurs in the insulated substrates.

DETAILED DESCRIPTION

In an embodiment of the present technique, a semiconductor device may further include a third insulated substrate including an insulator layer and a metal layer disposed on each of two faces of the insulator layer, and a fourth insulated substrate including an insulator layer and a metal layer disposed on each of two faces of the insulator layer. In this case, the third insulated substrate may be opposed to the first insulated substrate across the first semiconductor element, and the metal layer on one face of the third insulated substrate may be electrically connected with the first semiconductor element. Furthermore, the fourth insulated substrate may be opposed to the second insulated substrate across the second semiconductor element, and the metal layer on one face of the fourth insulated substrate may be electrically connected with the second semiconductor element. Here, the metal layer on the other face of the third insulated substrate and the metal layer on the other face of the fourth insulated substrate may be exposed on a second flat surface of the encapsulant that is located opposite to the first surface of the encapsulant. With this configuration, a double-sided cooling structure in which the insulated substrates are exposed on both surfaces of the encapsulant can be realized only by using the insulated substrates with a relatively small size.

In the above-mentioned embodiment, the semiconductor device may further include a first conductive spacer disposed between the first semiconductor element and the third insulated substrate; and a second conductive spacer disposed between the second semiconductor element and the fourth insulated substrate. In this case, each of linear expansion coefficients of the first conductive spacer and the second conductive spacer may be smaller than each of linear expansion coefficients of the metal layers of the first insulated substrate and the second insulated substrate and may be also smaller than a linear expansion coefficient of the encapsulant. This configuration suppresses an imbalance in thermal expansion occurring between regions in vicinities of the respective semiconductor elements and thereby also suppresses occurrence of local stress or distortion due to the thermal expansion.

In the above-mentioned embodiment, material of the metal layers of the first insulated substrate and the second insulated substrate may be copper, and material of the first conductive spacer and the second conductive spacer may be copper-molybdenum alloy or copper-tungsten alloy. These materials have excellent electrical conductivity while satisfying requirements associated with the above-mentioned linear expansion coefficients.

In an embodiment of the present technique, the metal layer on the one face may be greater in thickness than the metal layer on the other face in at least one of the first insulated substrate and the second insulated substrate. With this configuration, heat capacity of the metal layers located in proximities to the respective semiconductor elements becomes larger, so that changes in the temperature of the semiconductor elements can become moderate.

In an embodiment of the present technique, the metal layer on the other face may be greater in thickness than the metal layer on the one face in at least one of the first insulated substrate and the second insulated substrate. With this configuration, the thermal expansion of the metal layers located in proximities to the respective semiconductor elements tends to be suppressed by the insulator layers respectively, thereby making it possible to reduce the thermal stress and distortion due to the thermal expansion of the metal layer.

In an embodiment of the present technique, the metal layer on one face may be equal in thickness to the metal layer on the other face in at least one of the first insulated substrate and the second insulated substrate. With this configuration, a balance in the thermal expansion is achieved between the metal layers located on both faces of the insulator layer, so that the thermal stress acting on the insulator layer is reduced.

In an embodiment of the present technique, the insulated substrate may be, but is not limited to, a Direct Bonded Copper (DBC) substrate. It should be noted that the DBC substrate is also referred to as a Direct Copper Bonding (DCB) substrate.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

A semiconductor device 10 of an embodiment will be described below with reference to attached drawings. The semiconductor device 10 can be used in power conversion circuits, such as a converter and an inverter, in electrically powered vehicles, such as an electric vehicle, a hybrid vehicle, and a fuel cell vehicle. However, applications of the semiconductor device 10 are not particularly limited. The semiconductor device 10 can be widely used in various devices and circuits.

As shown in FIGS. 1, 2, 3, and 4, the semiconductor device 10 includes a first semiconductor element 20, a second semiconductor element 40, an encapsulant 12, and a plurality of external connection terminals 14, 15, 16, 18, and 19. The first semiconductor element 20 and the second semiconductor element 40 are encapsulated in the encapsulant 12.

The encapsulant 12 is constituted of, but not particularly limited to, for example, a thermosetting resin, such as an epoxy resin. Each of the external connection terminals 14, 15, 16, 18, and 19 extends from an outside to an inside of the encapsulant 12, and is electrically connected with at least one of the first semiconductor element 20 and the second semiconductor element 40 inside the encapsulant 12. The plurality of external connection terminals 14, 15, 16, 18, and 19 include a P terminal 14, an N terminal 15, and an O terminal 16, which are dedicated to electric power, and a plurality of first signal terminals 18 and a plurality of second signal terminals 19, which are dedicated to signal, by way of example.

Figure 3:
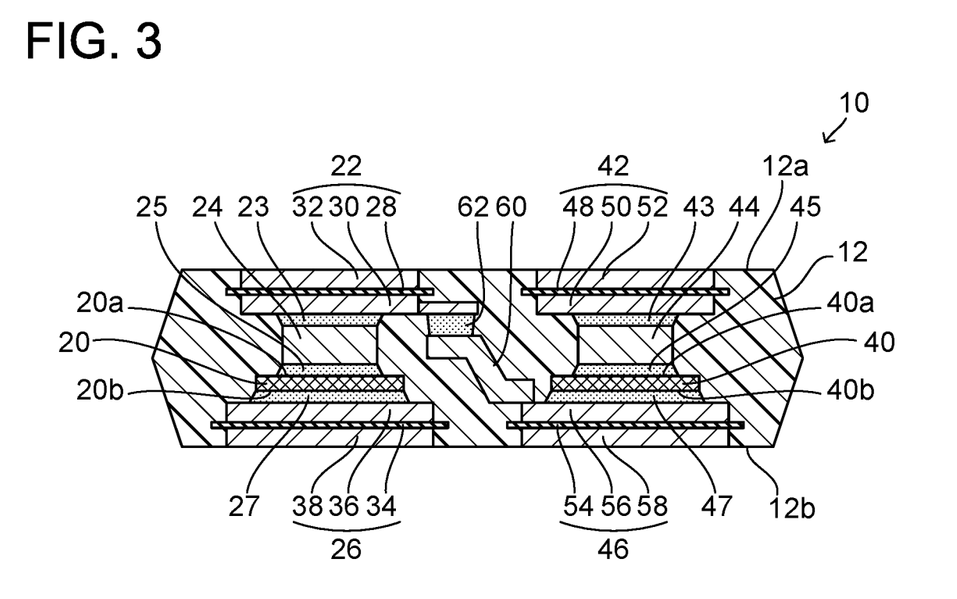
FIG. 3 shows a cross-sectional view along a line III-III in FIG. 1.
Figure 4:
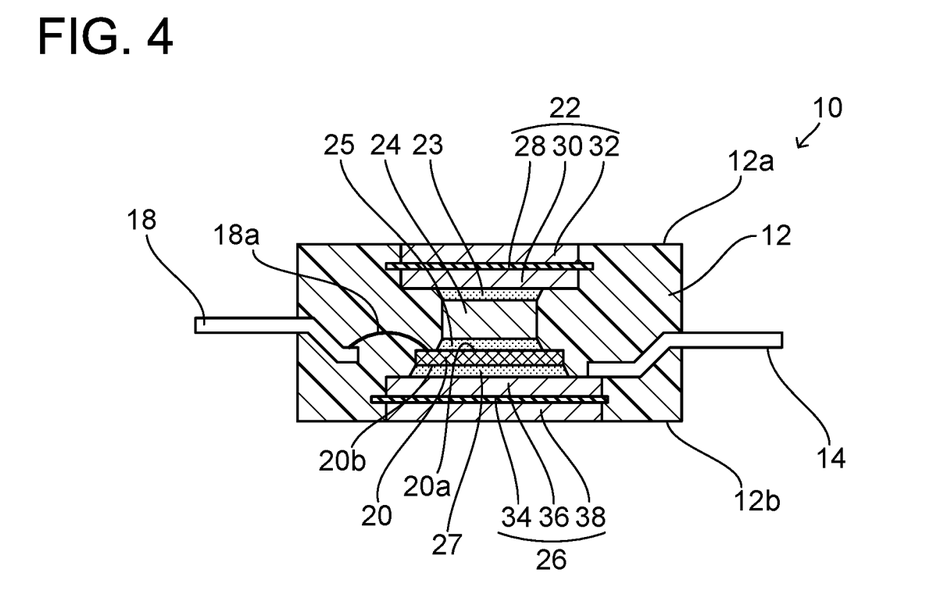
FIG. 4 shows a cross-sectional view along a line IV-IV in FIG. 1.

The first semiconductor element 20 has an upper electrode 20a and a lower electrode 20b. The upper electrode 20a is located on an upper surface of the first semiconductor element 20, and the lower electrode 20b is located on a lower surface of the first semiconductor element 20. The first semiconductor element 20 is a vertical semiconductor element that has a pair of upper and lower electrodes 20a and 20b. Similarly, the second semiconductor element 40 has an upper electrode 40a and a lower electrode 40b. The upper electrode 40a is located on an upper surface of the second semiconductor element 40, and the lower electrode 40b is located on a lower surface of the second semiconductor element 40. That is, the second semiconductor element 40 is also a vertical semiconductor element that has a pair of upper and lower electrodes 40a and 40b. The first semiconductor element 20 and the second semiconductor element 40 in the present embodiment are semiconductor elements of a same type. Specifically, each of the first semiconductor element 20 and the second semiconductor element 40 is a Reverse Conducting IGBT (RC-IGBT) element that incorporates therein an Insulated Gate Bipolar Transistor (IGBT) and a diode.

It should be noted that either or each of the first semiconductor element 20 and the second semiconductor element 40 is not limited to the RC-IGBT element, and may be another power semiconductor element, such as a Metal-Oxide-Semiconductor Field-Effect Transistor (MOSFET) element. Alternatively, either or each of the first semiconductor element 20 and the second semiconductor element 40 may be replaced by two or more semiconductor elements, including a diode element and an IGBT element (or MOSFET element). Specific configurations of the first semiconductor element 20 and the second semiconductor element 40 are not particularly limited, and can employ various semiconductor elements. In this case, the first semiconductor element 20 and the second semiconductor element 40 may be different semiconductor elements. Each of the first semiconductor element 20 and the second semiconductor element 40 can be constituted of various semiconductor materials, such as silicon (Si), silicon carbide (SiC), or gallium nitride (GaN).

The semiconductor device 10 further includes a first upper insulated substrate 22, a first conductive spacer 24, and a first lower insulated substrate 26. The first upper insulated substrate 22 includes an insulator layer 28, an inner metal layer 30 disposed on one face of the insulator layer 28, and an outer metal layer 32 disposed on the other face of the insulator layer 28. The inner metal layer 30 and the outer metal layer 32 are insulated from each other by the insulator layer 28. The inner metal layer 30 of the first upper insulated substrate 22 is electrically connected with the upper electrode 20a of the first semiconductor element 20 via the first conductive spacer 24. This connection is not particularly limited, but in the present embodiment, employs soldering. Specifically, a solder layer 23 is provided between the first upper insulated substrate 22 and the first conductive spacer 24, and a solder layer 25 is provided between the first conductive spacer 24 and the first semiconductor element 20.

The first upper insulated substrate 22 of the present embodiment is a DBC substrate by way of example. The insulator layer 28 is constituted of ceramic, such as aluminum oxide, silicon nitride, aluminum nitride, or the like, and each of the inner metal layer 30 and the outer metal layer 32 is constituted of copper. It should be noted that the first upper insulated substrate 22 is not limited to the DBC substrate. The insulator layer 28 is constituted of, but not limited to, ceramic or any other insulating material. The inner metal layer 30 and the outer metal layer 32 are constituted of, but not limited to, copper, or any other metal. Furthermore, a joint structure between the insulator layer 28 and each of the metal layers 30 and 32 is also not particularly limited. The first conductive spacer 24 of the present embodiment is constituted of a copper-molybdenum alloy. It should be noted that material of the first conductive spacer 24 is not limited to a copper-molybdenum alloy, and may be any other conductor, such as pure copper or another copper alloy.

The first lower insulated substrate 26 includes an insulator layer 34, an inner metal layer 36 disposed on one face of the insulator layer 34, and an outer metal layer 38 disposed on the other face of the insulator layer 34. The inner metal layer 36 and the outer metal layer 38 are insulated from each other by the insulator layer 34. The inner metal layer 36 of the first lower insulated substrate 26 is electrically connected with the lower electrode 20b of the first semiconductor element 20. This connection is not particularly limited, but in the present embodiment, employs soldering. Specifically, a solder layer 27 is provided between the first semiconductor element 20 and the first lower insulated substrate 26.

The first lower insulated substrate 26 of the present embodiment is a DBC substrate by way of example. The insulator layer 34 is constituted of ceramic, such as aluminum oxide, silicon nitride, aluminum nitride, or the like, and each of the inner metal layer 36 and the outer metal layer 38 is constituted of copper. It should be noted that the first lower insulated substrate 26 is not limited to the DBC substrate. The insulator layer 34 is constituted of, but not limited to, ceramic or any other insulating material. The inner metal layer 36 and the outer metal layer 38 are constituted of, but not limited to, copper or any other metal. Furthermore, a joint structure between the insulator layer 34 and each of the metal layers 36 and 38 is also not particularly limited.

The outer metal layer 32 of the first upper insulated substrate 22 is exposed on an upper flat surface 12a of the encapsulant 12. Thus, the first upper insulated substrate 22 not only constitutes a part of an electric circuit of the semiconductor device 10, but also functions as a heat sink that mainly dissipates the heat in the first semiconductor element 20 into the outside. Similarly, the outer metal layer 38 of the first lower insulated substrate 26 is exposed on a lower surface 12b of the encapsulant 12. Thus, the first lower insulated substrate 26 functions not only as a part of the electric circuit of the semiconductor device 10, but also as a heat sink that mainly dissipates the heat in the first semiconductor element 20 into the outside. In this way, the semiconductor device 10 of the present embodiment has a double-sided cooling structure in which the outer metal layers 32 and 38 are exposed on both upper and lower surfaces 12a and 12b of the encapsulant 12, respectively.

The semiconductor device 10 further includes a second upper insulated substrate 42, a second conductive spacer 44, and a second lower insulated substrate 46. The second upper insulated substrate 42 includes an insulator layer 48, an inner metal layer 50 disposed on one face of the insulator layer 48, and an outer metal layer 52 disposed on the other face of the insulator layer 48. The inner metal layer 50 and the outer metal layer 52 are insulated from each other by the insulator layer 48. The inner metal layer 50 of the second upper insulated substrate 42 is electrically connected with the upper electrode 40a of the second semiconductor element 40 via the second conductive spacer 44. This connection is not particularly limited and employs soldering in the present embodiment. Specifically, a solder layer 43 is provided between the second upper insulated substrate 42 and the second conductive spacer 44, and a solder layer 45 is provided between the second conductive spacer 44 and the second semiconductor element 40.

The second upper insulated substrate 42 of the present embodiment is a DBC substrate by way of example. The insulator layer 48 is constituted of ceramic, such as aluminum oxide, silicon nitride, aluminum nitride, or the like, and each of the inner metal layer 50 and the outer metal layer 52 is constituted of copper. It should be noted that the second upper insulated substrate 42 is not limited to the DBC substrate. The insulator layer 48 is constituted of, but not limited to, ceramic or any other insulating material. The inner metal layer 50 and the outer metal layer 52 are constituted of, but not limited to, copper or any other metal. Furthermore, a joint structure between the insulator layer 48 and each of the metal layers 50 and 52 is also not particularly limited. The second conductive spacer 44 of the present embodiment is constituted of copper-molybdenum alloy. It should be noted that the second conductive spacer 44 is not limited to the copper-molybdenum alloy, but may be constituted of any other conductor, such as pure copper or another copper alloy.

The second lower insulated substrate 46 includes an insulator layer 54, an inner metal layer 56 disposed on one face of the insulator layer 54, and an outer metal layer 58 disposed on the other face of the insulator layer 54. The inner metal layer 56 and the outer metal layer 58 are insulated from each other by the insulator layer 54. The inner metal layer 56 of the second lower insulated substrate 46 is electrically connected with the lower electrode 40b of the second semiconductor element 40. This connection is not particularly limited and employs soldering in the present embodiment. Specifically, a solder layer 47 is provided between the second semiconductor element 40 and the second lower insulated substrate 46.

The second lower insulated substrate 46 of the present embodiment is a DBC substrate by way of example. The insulator layer 54 is constituted of ceramic, such as aluminum oxide, silicon nitride, aluminum nitride, or the like, and each of the inner metal layer 56 and the outer metal layer 58 is constituted of copper. It should be noted that the second lower insulated substrate 46 is not limited to the DBC substrate. The insulator layer 54 is not limited to ceramic, but may be constituted of any other insulating material. The inner metal layer 56 and the outer metal layer 58 are not limited to copper, but may be constituted of any other metal. Furthermore, a joint structure between the insulator layer 54 and each of the metal layers 56 and 58 is also not particularly limited.

The outer metal layer 52 of the second upper insulated substrate 42 is exposed on the upper flat surface 12a of the encapsulant 12. Thus, the second upper insulated substrate 42 not only constitutes a part of an electric circuit of the semiconductor device 10, but also functions as a heat sink that mainly dissipates the heat of the second semiconductor element 40 into the outside. Similarly, the outer metal layer 58 of the second lower insulated substrate 46 is exposed on the lower flat surface 12b of the encapsulant 12. Thus, the second lower insulated substrate 46 not only constitutes a part of the electric circuit of the semiconductor device 10, but also functions as a heat sink that mainly dissipates the heat of the second semiconductor element 40 into the outside. In this way, also with regard to the second semiconductor element 40, the semiconductor device 10 of the present embodiment has a double-sided cooling structure in which the outer metal layers 52 and 58 are exposed on both the upper and lower surfaces 12a and 12b of the encapsulant 12, respectively.

The semiconductor device 10 further includes a joint 60 constituted of a conductor. The joint 60 is located inside the encapsulant 12, and electrically connects the inner metal layer 30 of the first upper insulated substrate 22 and the inner metal layer 56 of the second lower insulated substrate 46. Thus, the first semiconductor element 20 and the second semiconductor element 40 are connected in series via the joint 60. The joint 60 of the present embodiment is constituted of copper by way of example. The joint 60 is joined with the inner metal layer 30 of the first upper insulated substrate 22 via a solder layer 62, and also joined with the inner metal layer 56 of the second lower insulated substrate 46 by welding.

Figure 1:
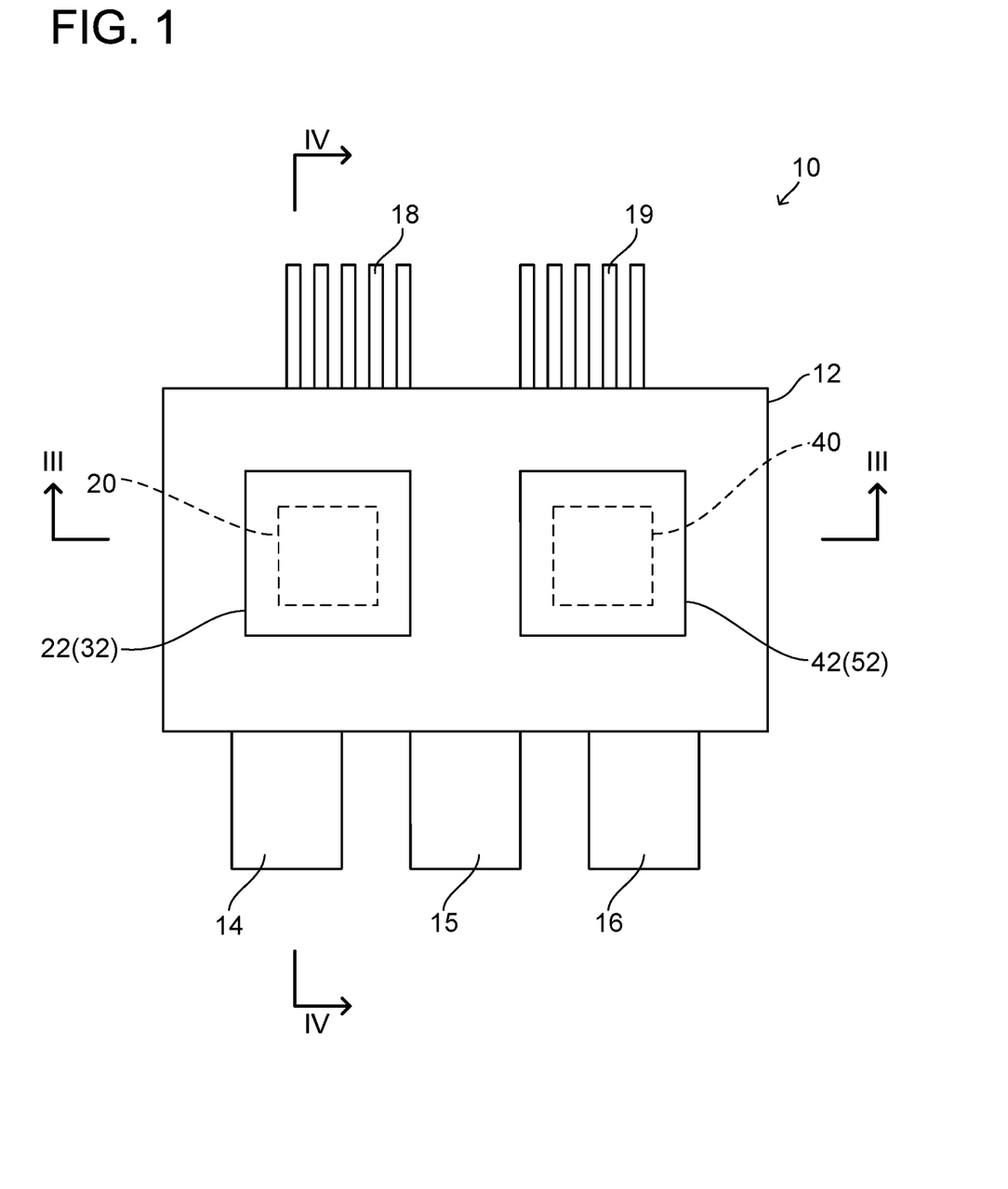
FIG. 1 shows a plan view of a semiconductor device 10 according to an embodiment.
Figure 2:
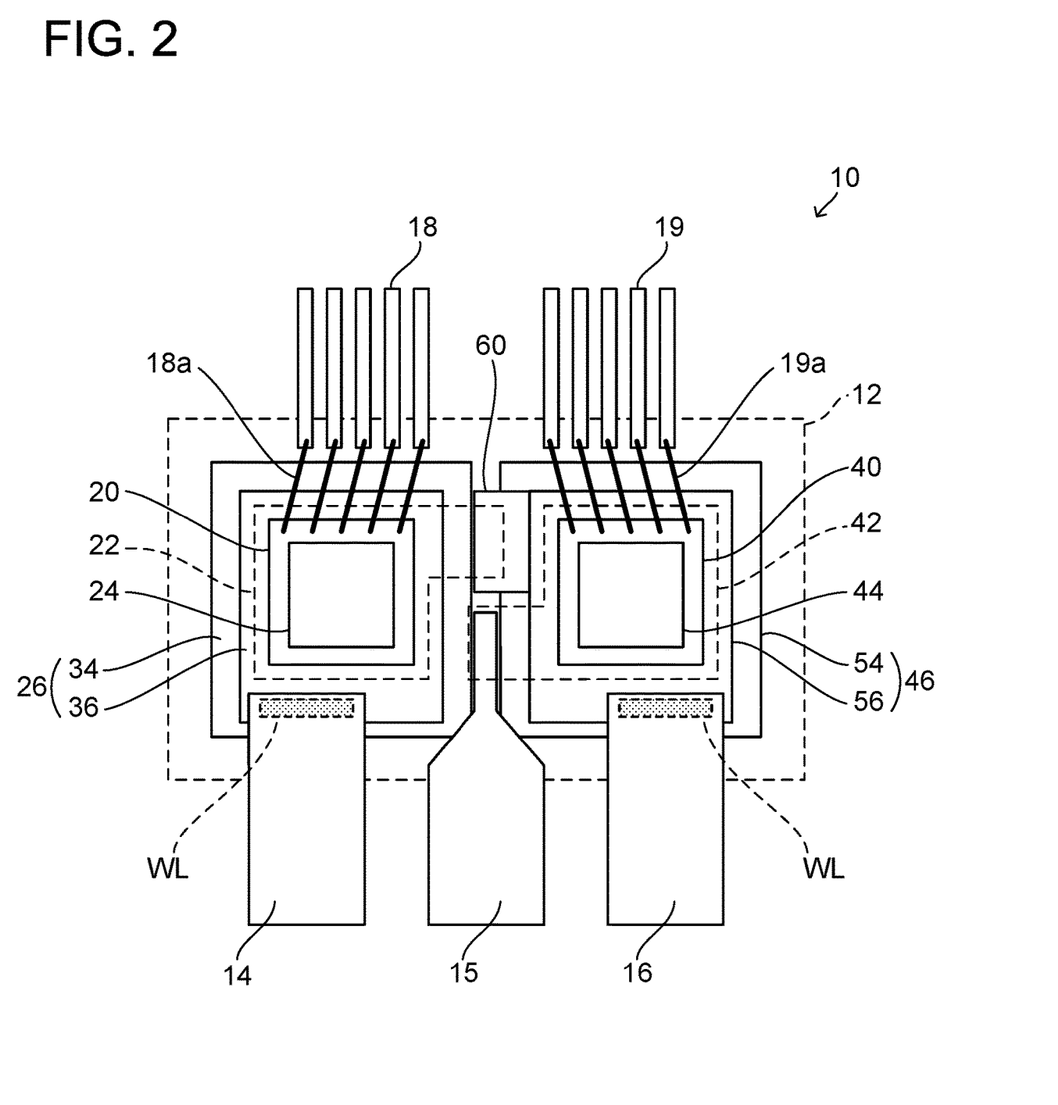
FIG. 2 shows an internal structure of the semiconductor device 10 of the embodiment.

As mentioned above, the semiconductor device 10 includes the P terminal 14, the N terminal 15, and the O terminal 16 as the external connection terminals. The P terminal 14, the N terminal 15, and the O terminal 16 of the present embodiment are constituted of copper. It should be noted that materials of the P terminal 14, the N terminal 15, and the O terminal 16 are not limited to copper, and may be constituted of other conductors. The P terminal 14 is joined with the inner metal layer 36 of the first lower insulated substrate 26 inside the encapsulant 12. The N terminal 15 is joined with the inner metal layer 50 of the second upper insulated substrate 42 inside the encapsulant 12. The O terminal 16 is joined with the inner metal layer 56 of the second lower insulated substrate 46. By way of example, the P terminal 14 and the O terminal 16 are joined with the inner metal layer 36 of the first lower insulated substrate 26 and the inner metal layer 56 of the second lower insulated substrate 46, respectively, by the welding. Here, the ranges WL shown in the drawing herein indicate joining sites by the welding.

The plurality of first signal terminals 18 is connected to the first semiconductor element 20 via bonding wires 18a, and the plurality of second signal terminals 19 is connected to the second semiconductor element 40 via bonding wires 19a. Here, the numbers and specific configurations of the first signal terminals 18 and the second signal terminals 19 are not particularly limited. The semiconductor device 10 does not necessarily include the first signal terminal 18 and the second signal terminal 19.

In the semiconductor device 10 of the present embodiment, the first lower insulated substrate 26 and the second lower insulated substrate 46 are provided, the first semiconductor element 20 is disposed on the first lower insulated substrate 26, and the second semiconductor element 40 is disposed on the second lower insulated substrate 46. Here, the first lower insulated substrate 26 and the second lower insulated substrate 46 are exposed on the same lower flat surface 12b of the encapsulant 12. The first lower insulated substrate 26 and the second lower insulated substrate 46 that have such a positional relationship are constituted of a single insulated substrate in the related art. This is because in the insulated substrate, a pattern on a metal layer can be flexibly divided on an insulator layer, so that the insulated substrate itself does not need to be divided. However, the present embodiment is designed to employ the two divided lower insulated substrates 26 and 46. Thus, each of the relatively small-sized lower insulated substrates 26 and 46 can be used. As the size of each of the lower insulated substrates 26 and 46 is reduced, the thermal stress that occurs in the respective lower insulated substrates 26 and 46 can be reduced. Here, the first lower insulated substrate 26 is one example of the first insulated substrate in the present technique, while the second lower insulated substrate 46 is one example of the second insulated substrate in the present technique.

The semiconductor device 10 of the present embodiment further includes the first upper insulated substrate 22 and the second upper insulated substrate 42; the respective outer metal layers 32 and 52 of the first upper insulated substrate 22 and the second upper insulated substrate 42 are exposed on the same upper flat surface 12*a* of the encapsulant 12. That is, the semiconductor device 10 has the double-sided cooling structure. The first upper insulated substrate 22 and the second upper insulated substrate 42 are also constituted of a single insulated substrate in the related art. However, the present embodiment is designed to employ the two divided upper insulated substrates 22 and 42. Thus, each of the relatively small-sized upper insulated substrates 22 and 42 can be used. As the size of each of the upper insulated substrates 22 and 42 is reduced, the thermal stress that occurs in the respective upper insulated substrates 22 and 42 can be reduced. Here, the first upper insulated substrate 22 is one example of the third insulated substrate in the present technique, while the second upper insulated substrate 42 is one example of the fourth insulated substrate in the present technique.

Figure 5A:
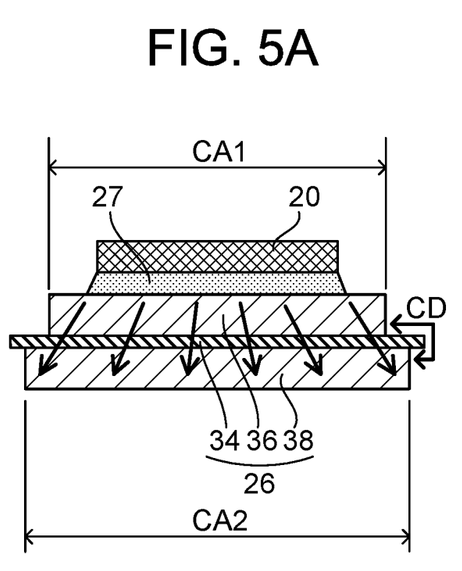
FIGS. 5A and 5B show variants of lower insulated substrates 26 and 46, and more specifically, illustrate variants regarding contact areas CA1 and CA2 of metal layers 36 and 38.
Figure 5B:
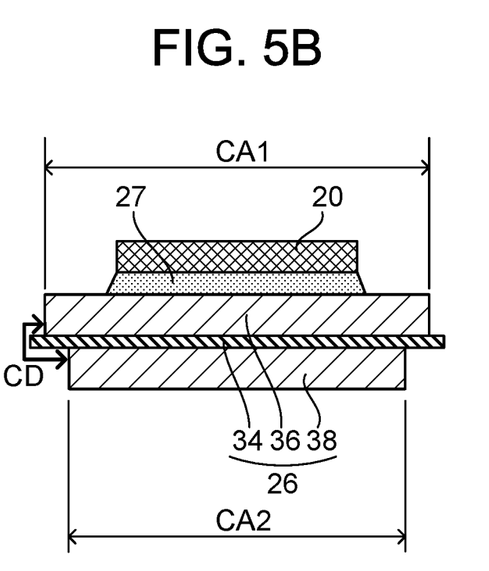

As can be seen from FIGS. 3 and 4, in the first lower insulated substrate 26 of the present embodiment, a contact area between the insulator layer 34 and the inner metal layer 36 is substantially equal to a contact area between the insulator layer 34 and the outer metal layer 38. With this configuration, the balance in thermal expansion is achieved between the inner metal layer 36 and the outer metal layer 38, so that the thermal stress acting on the insulator layer 34 is reduced. However, in another embodiment, as shown in FIG. 5A, a contact area CA2 between the insulator layer 34 and the outer metal layer 38 may be larger than a contact area CA1 between the insulator layer 34 and the inner metal layer 36. With this configuration, the heat dissipation property of the first lower insulated substrate 26 can be enhanced while maintaining a creeping distance CD between the inner metal layer 36 and the outer metal layer 38. Alternatively, in another embodiment, as shown in FIG. 511, a contact area CA1 between the insulator layer 34 and the inner metal layer 36 may be larger than a contact area CA2 between the insulator layer 34 and the outer metal layer 38. With this configuration, the flexibility in the arrangement of the first semiconductor element 20 can be enhanced while maintaining a creeping distance CD between the inner metal layer 36 and the outer metal layer 38. These points can also be applied to the second lower insulated substrate 46, and a duplicated description thereof will be omitted.

Figure 6A:
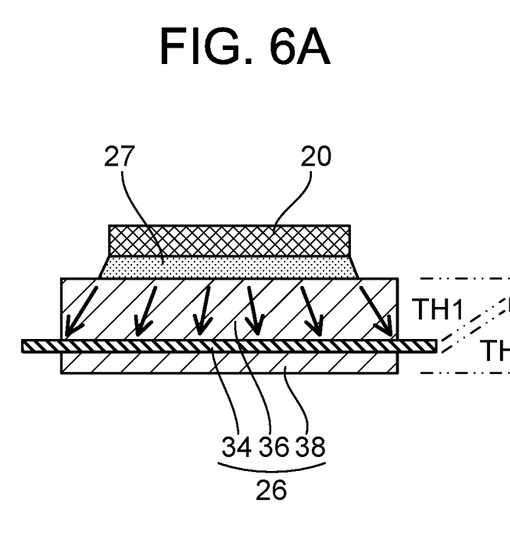
FIGS. 6A and 6B show variants of lower insulated substrates 26 and 46, and more specifically, illustrate variants regarding thicknesses TH1 and TH2 of the metal layers 36 and 38.
Figure 6B:
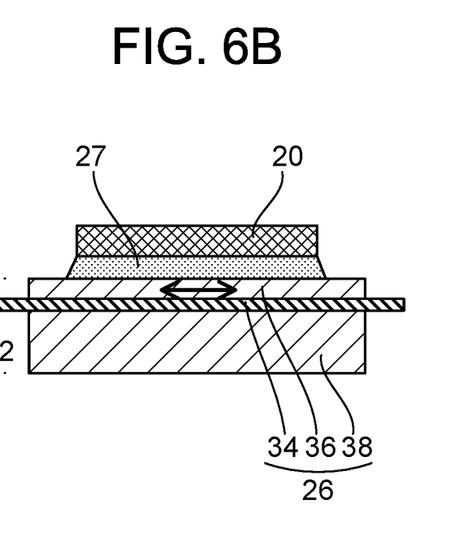

As shown in FIG. 6A, in the first lower insulated substrate 26 of the present embodiment, a thickness TH1 of the inner metal layer 36 is larger than a thickness TH2 of the outer metal layer 38. With this configuration, the heat capacity of the inner metal layer 36 in proximity to the first semiconductor element 20 becomes larger, thereby making it possible to render changes in the temperature of the first semiconductor element 20 moderate. It should be noted that in another embodiment, as shown in FIG. 6B, a thickness TH2 of the outer metal layer 38 may be larger than a thickness TH1 of the inner metal layer 36. With this configuration, the thermal expansion of the inner metal layer 36 in proximity to the first semiconductor element 20 can be reduced by the insulator layer 34, thereby reducing the thermal stress that occurs, for example, in the solder layer 27 located between the first semiconductor element 20 and the first lower insulated substrate 26. Alternatively, the thickness TH1 of the inner metal layer 36 may be substantially equal to the thickness TH2 of the outer metal layer 38. With this configuration, the balance in thermal expansion is achieved between the inner metal layer 36 and the outer metal layer 38, whereby the thermal stress acting on the insulator layer 34 is reduced.

Figure 7:
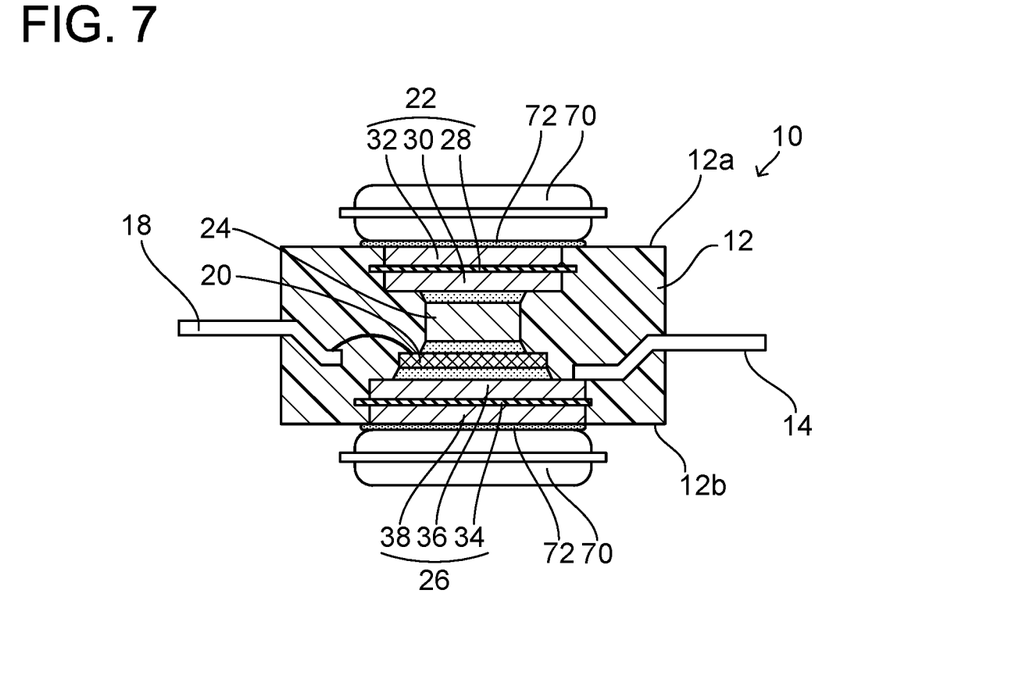
FIG. 7 shows the semiconductor device 10 disposed between coolers 70.

In the semiconductor device 10 of the present embodiment, the outer metal layers 32 and 52 exposed on the upper surface 12*a* of the encapsulant 12 and the outer metal layers 38 and 58 exposed on the lower surface 12*b* of the encapsulant 12 are electrically insulated by the insulator layers 28, 34, 48, and 54. Thus, as shown in FIG. 7, a cooler 70 can be disposed on each of the upper surface 12*a* and lower surface 12*b* of the encapsulant 12 without interposing any insulator plate therebetween. In this case, a heat dissipation grease 72 may be interposed between the semiconductor device 10 and the cooler 70 as necessary. With regard to the heat dissipation grease 72, if the insulator plate is disposed between the semiconductor device 10 and the cooler 70, the heat dissipation grease 72 needs to be applied to both surfaces of the insulator plate. That is, two layers constituted of the heat dissipation grease 72 are provided between the semiconductor device 10 and the cooler 70. In contrast, in the semiconductor device 10 of the present embodiment, only one layer of the heat dissipation grease 72 is provided between the semiconductor device 10 and the cooler 70 because there is no need to interpose an insulator plate therebetween. Hence, by reducing a number of layers of the heat dissipation grease 72, heat resistance from the semiconductor device 10 to the cooler 70 is reduced.

Figure 8A:
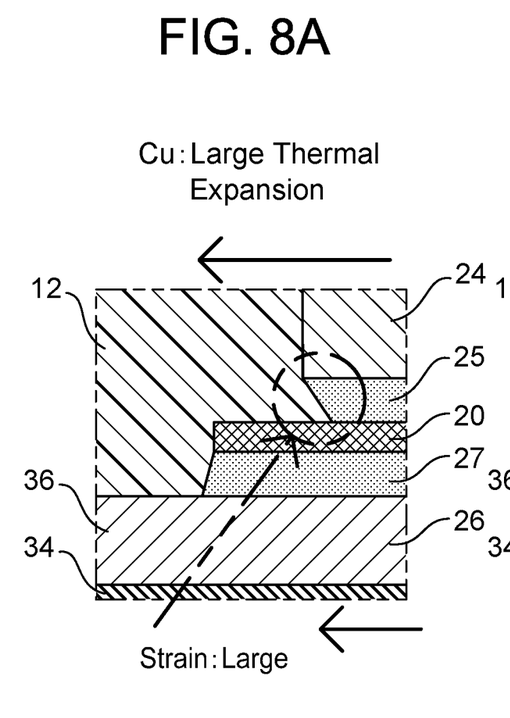
FIGS. 8A and 8B illustrate distortion in a solder layer 25 caused by thermal expansion of a first conductive spacer 24.
Figure 8B:
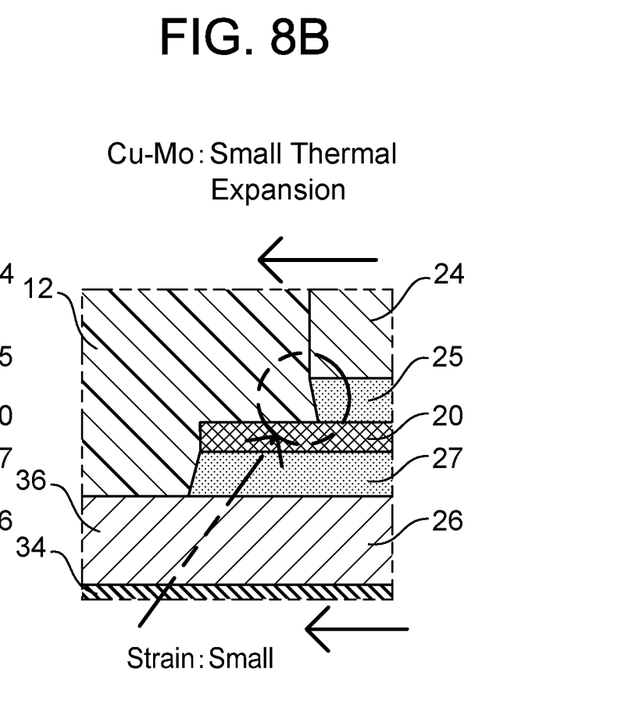

As mentioned above, each of the first conductive spacer 24 and the second conductive spacer 44 in the present embodiment is constituted of copper-molybdenum alloy. The linear expansion coefficient of the copper-molybdenum alloy is smaller than each of the linear expansion coefficient of copper constituting the inner metal layers 36 and 56 and the linear expansion coefficient of an epoxy resin constituting the encapsulant 12. In this way, the linear expansion coefficient of the first conductive spacer 24 is smaller than the linear expansion coefficient of the inner metal layer 36, and also smaller than the linear expansion coefficient of the encapsulant 12. Furthermore, the linear expansion coefficient of the second conductive spacer 44 is smaller than the linear expansion coefficient of the inner metal layer 56, and also smaller than the linear expansion coefficient of the encapsulant 12. Consequently, this can reduce distortion that occurs in the solder layer 25 located between the first conductive spacer 24 and the first semiconductor element 20, and in the solder layer 45 located between the second conductive spacer 44 and the second semiconductor element 40. For example, as shown in FIG. 8A, if the first conductive spacer 24 is constituted of copper, an amount of thermal expansion that occurs in the first conductive spacer 24 becomes relatively large. Meanwhile, an amount of thermal expansion that occurs in the first semiconductor element 20 and the first lower insulated substrate 26 is relatively small. In this case, there occurs a large difference in the amount of thermal expansion between portions located above and below the first semiconductor element 20, resulting in an occurrence of distortion in the solder layer 25, which is located between the first conductive spacer 24 and the first semiconductor element 20, causing problems of deterioration or damage of the solder layer 25. In contrast, as shown in FIG. 8B, when the first conductive spacer 24 is constituted of material having a small linear expansion coefficient, the amount of heat expansion that occurs above the first semiconductor element 20 is reduced, thus suppressing the distortion that occurs in the solder layer 25. This point can also be applied to the second conductive spacer 44 in the same manner. Examples of the material constituting the first conductive spacer 24 and the second conductive spacer 44 include, but are not limited to, copper-tungsten alloy and also copper-molybdenum alloy.

Figure 9:
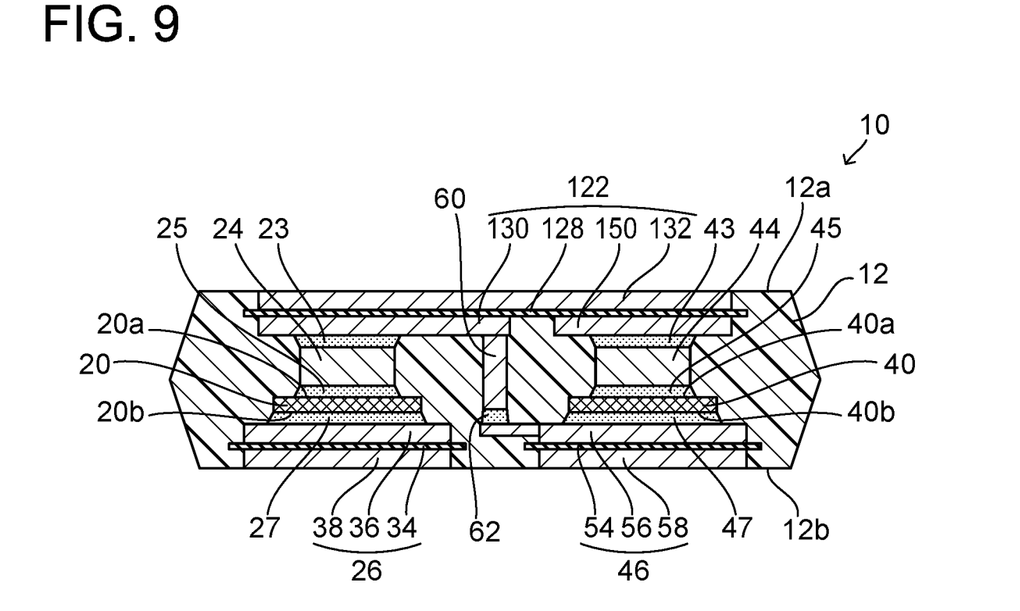
FIG. 9 shows a variant of the semiconductor device 10 in the embodiment, which employs a common upper insulated substrate 122.

As shown in FIG. 9, in the semiconductor device 10 of the present embodiment, the first upper insulated substrate 22 and the second upper insulated substrate 42 may be constituted of a single common upper insulated substrate 122. The common upper insulated substrate 122 includes a common insulator layer 128, a first inner metal layer 130 and a second inner metal layer 150 disposed on one face of the common insulator layer 128, and a common outer metal layer 132 disposed on the other face of the common insulator layer 128. The first inner metal layer 130 is connected to the upper electrode 20a of the first semiconductor element 20 via the first conductive spacer 24. The second inner metal layer 150 is connected to the upper electrode 40a of the second semiconductor element 40 via the second conductive spacer 44. The joint 60 is integrated with the first inner metal layer 130. The common outer metal layer 132 is exposed on the upper surface 12a of the encapsulant 12.

When the first upper insulated substrate 22 and the second upper insulated substrate 42 are constituted of a single common upper insulated substrate 122, the first inner metal layer 130 or the second inner metal layer 150 can be provided widely, and hence, for example, the joint 60 can be integrated with the first inner metal layer 130. When the joint 60 is integrated with the first inner metal layer 130 (that is, the common upper insulated substrate 122), a manufacturing process of the semiconductor device 10 can be simplified.

Figure 10:
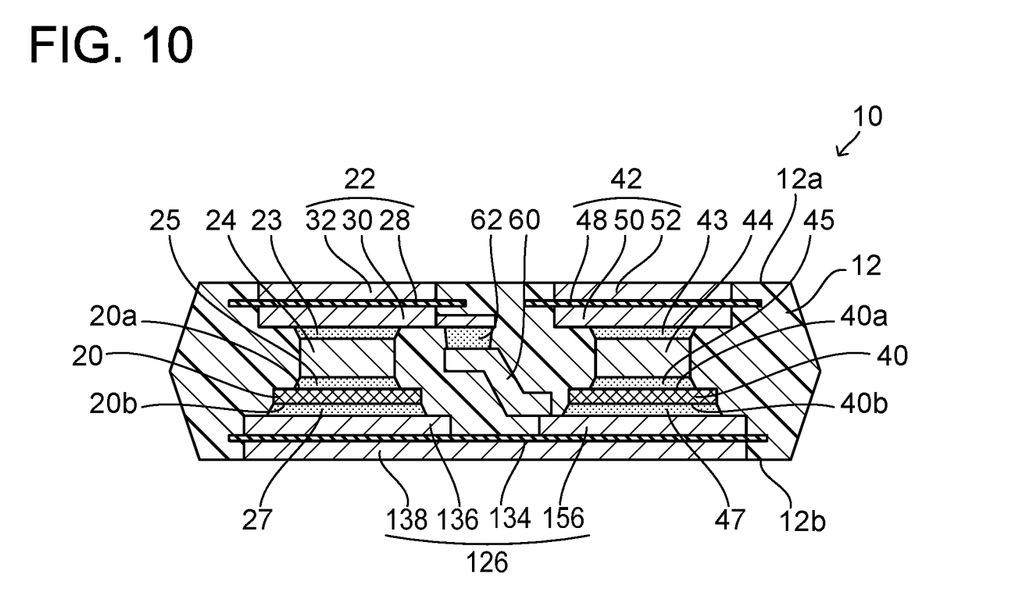
FIG. 10 shows another variant of the semiconductor device 10 in the embodiment, which employs a common lower insulated substrate 126.

Instead of the above configuration, as shown in FIG. 10, in the semiconductor device 10 according to the present embodiment, the first lower insulated substrate 26 and the second lower insulated substrate 46 may be replaced by a single common lower insulated substrate 126. The common lower insulated substrate 126 includes a common insulator layer 134, a first inner metal layer 136 and a second inner metal layer 156 disposed on one face of the common insulator layer 134, and a common outer metal layer 138 disposed on the other face of the common insulator layer 134. The first inner metal layer 136 is connected to the lower electrode 20b of the first semiconductor element 20. The second inner metal layer 156 is connected to the lower electrode 40b of the second semiconductor element 40.

When the first lower insulated substrate 26 and the second lower insulated substrate 46 are constituted of the single common lower insulated substrate 126, the heat dissipation property of the semiconductor device 10 can be enhanced. In particular, the first lower insulated substrate 26 and the second lower insulated substrate 46 are located in proximities to the first semiconductor element 20 and the second semiconductor element 40, respectively. As such, the first lower insulated substrate 26 and the second lower insulated substrate 46 are constituted of the common lower insulated substrate 126 with excellent heat dissipation property, so that the heat dissipation property of the semiconductor device 10 can be effectively improved as a whole.

Figure 11A:
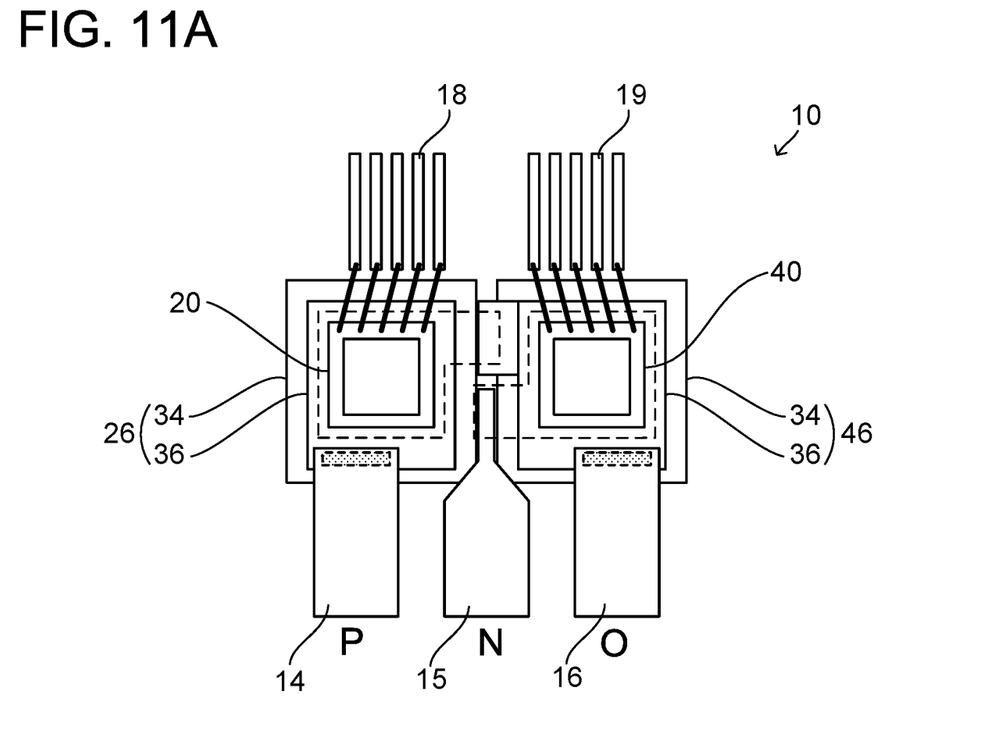
FIGS. 11A and 11B illustrate a structure and an application of the semiconductor device 10 in the embodiment, respectively.
Figure 11B:
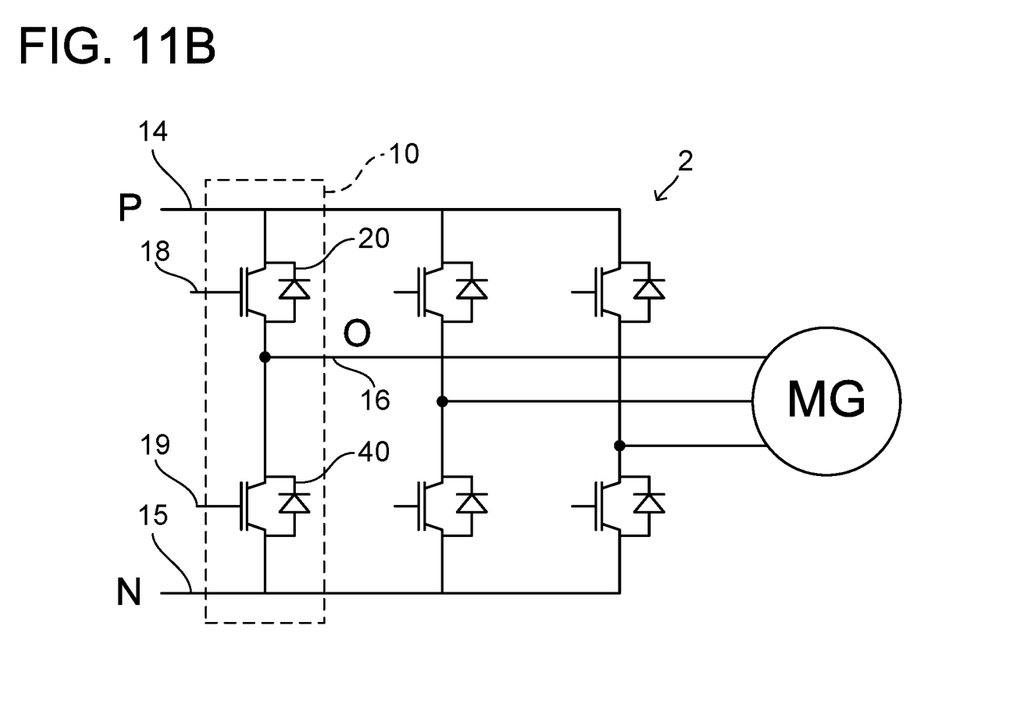

As shown in FIGS. 11A and 11B, the semiconductor device 10 incorporates two semiconductor elements 20 and 40, and these two semiconductor elements 20 and 40 are connected in series. Here, each of the semiconductor elements 20 and 40 is an RC-IGBT. Thus, the semiconductor device 10 can be employed as a component constituting, for example, a pair of upper and lower arms in an inverter circuit 2. However, the technique disclosed herein is not limited by the number of semiconductor elements 20 and 40 or to the connection structure thereof, and can also be applied to various semiconductor devices, such as the semiconductor devices 210 and 310 shown in FIGS. 12 and 13.

Figure 12A:
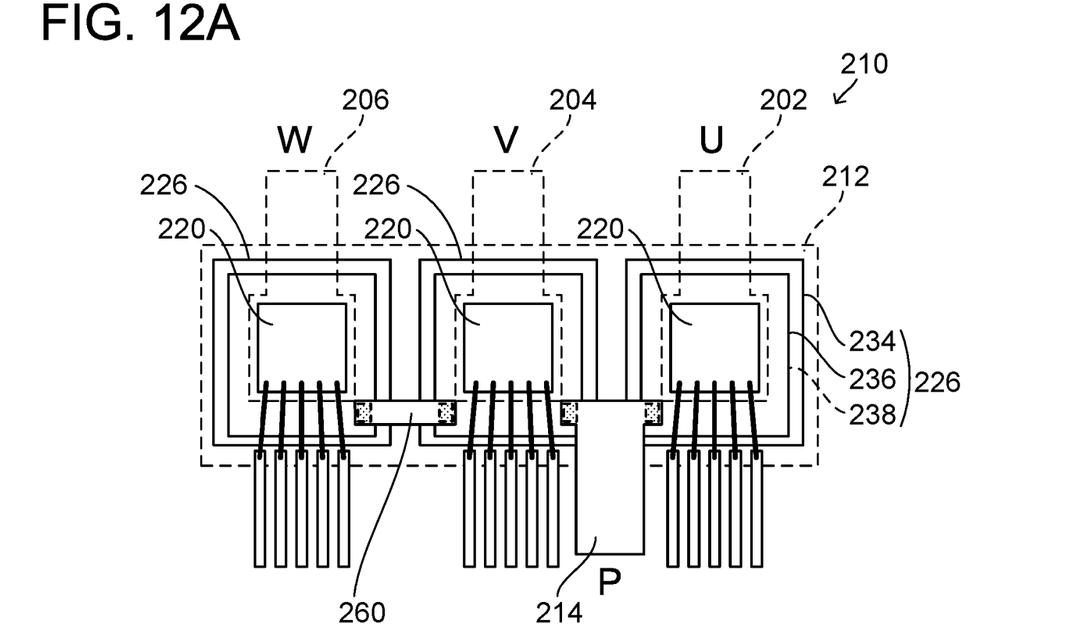
FIGS. 12A and 12B illustrate a structure and an application of a semiconductor device 210 in another embodiment, respectively.
Figure 12B:
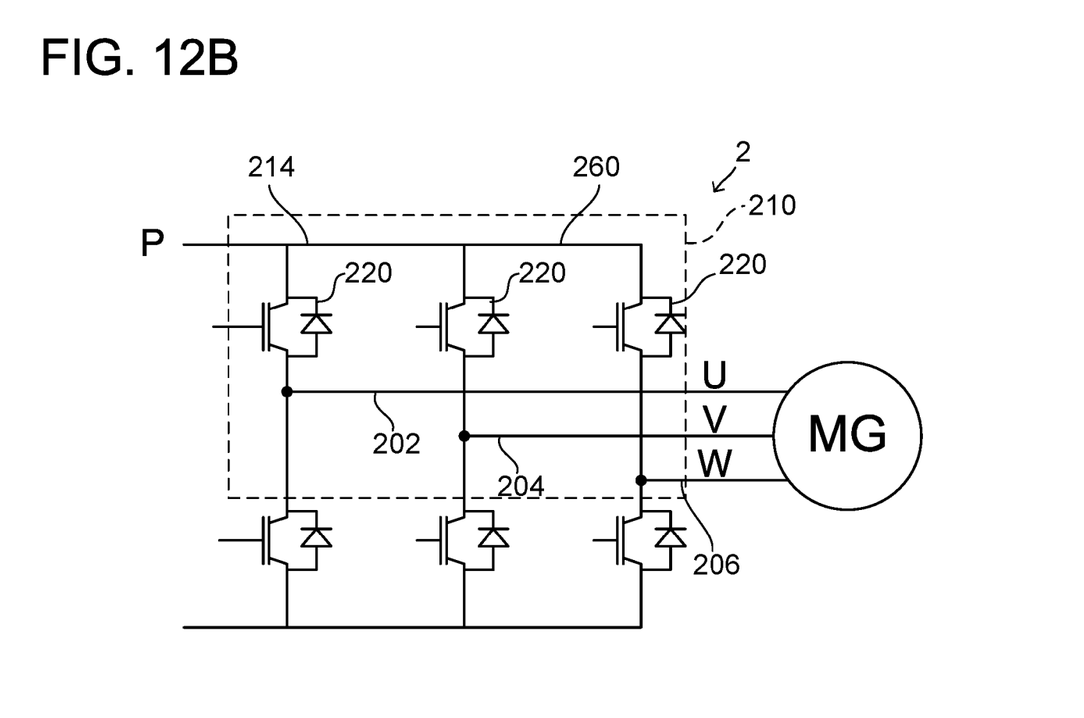

As shown in FIGS. 12A and 12B, the semiconductor device 210 of another embodiment incorporates three semiconductor elements 220, each of which is connected to a P-terminal 214. Each of a U terminal 202, a V terminal 204, and a W terminal 206 is connected to a corresponding one of the three semiconductor elements 220. Each of the semiconductor elements 220 is, but not limited to, an RC-IGBT. The semiconductor device 210 can be employed as a component constituting, for example, three upper arms in the inverter circuit 2. A specific configuration of the semiconductor device 210 is not particularly limited. Here, the semiconductor device 210 includes three lower insulated substrates 226. Each of the lower insulated substrates 226 includes an insulator layer 234, an inner metal layer 236 located on one face of the insulator layer 234, and an outer metal layer 238 located on the other face of the insulator layer 234. A corresponding one of the three semiconductor elements 220 is mounted on the inner metal layer 236 of each lower insulated substrate 226. The semiconductor device 210 includes an encapsulant 212 encapsulating the semiconductor element 220, and the outer metal layers 238 of the three insulated substrates 226 are exposed on a same flat surface of the encapsulant 212. Two of the three lower insulated substrates 226 may be constituted of a single insulated substrate.

Figure 13A:
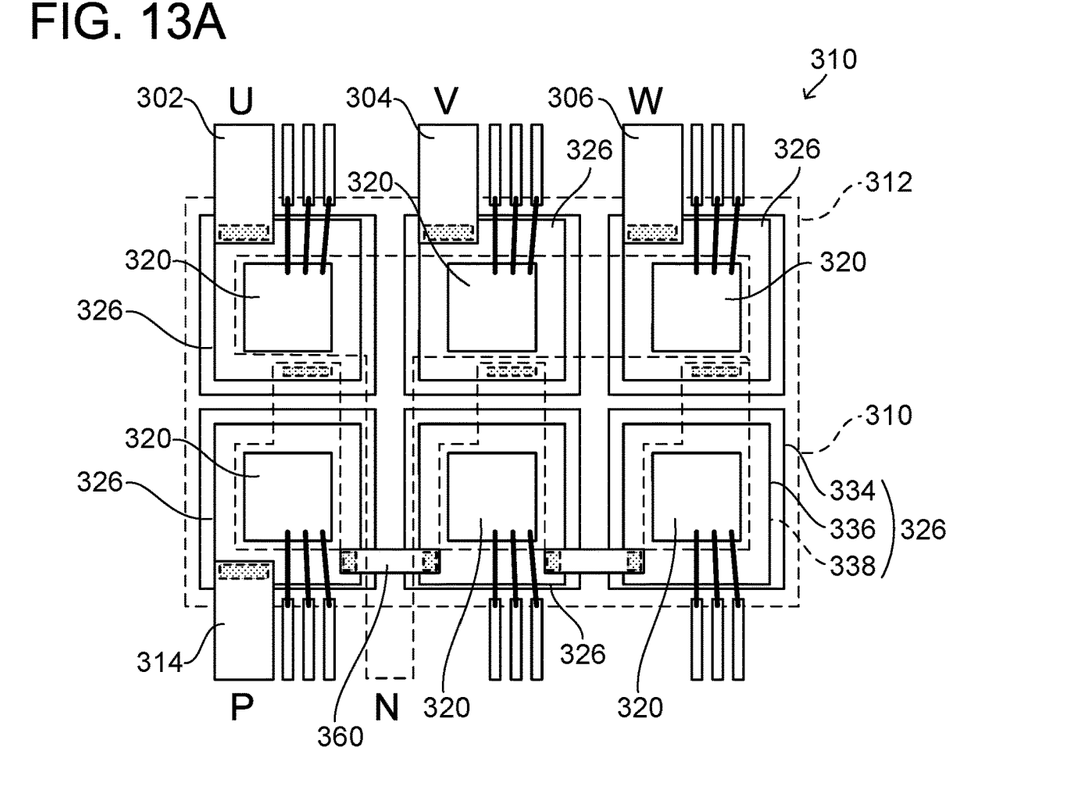
FIGS. 13A and 13B illustrate a structure and an application of a semiconductor device 310 in another embodiment, respectively.
Figure 13B:
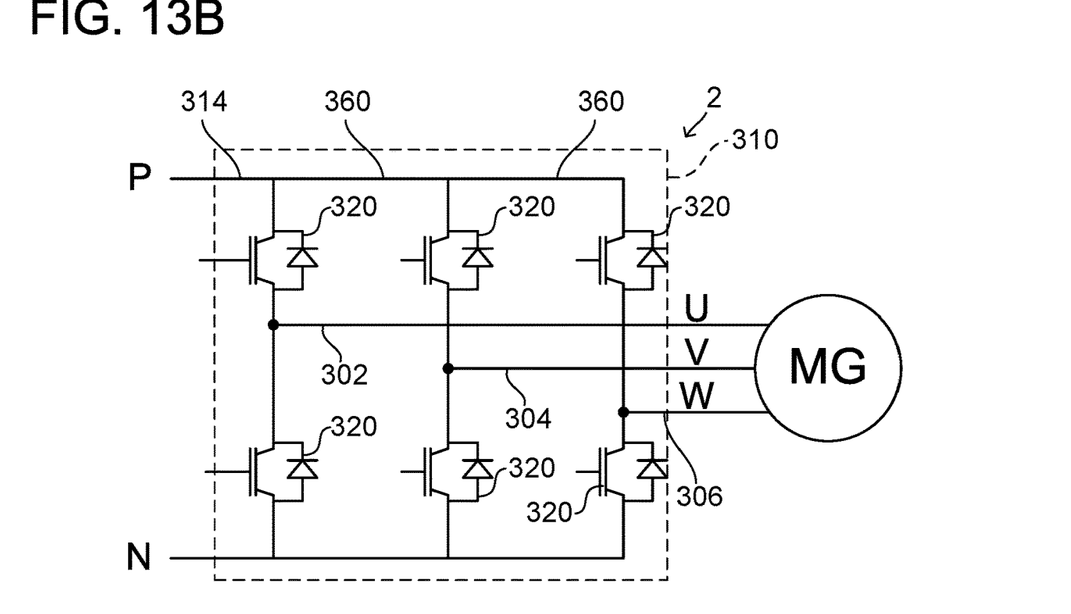

As shown in FIGS. 13A and 13B, a semiconductor device 310 of another embodiment incorporates six semiconductor elements 320, each of which is connected to constitute an inverter circuit 2. Each of the semiconductor elements 320 is, but not limited to, an RC-IGBT. Such a semiconductor device 310 can singly constitute the inverter circuit 2. A specific configuration of the semiconductor device 310 is not particularly limited. Here, the semiconductor device 310 includes six lower insulated substrates 326. Each of the lower insulated substrates 326 includes an insulator layer 334, an inner metal layer 336 located on one face of the insulator layer 334, and an outer metal layer 338 located on the other face of the insulator layer 334. A corresponding one of the six semiconductor elements 220 is mounted on the inner metal layer 336 of each lower insulated substrate 326. The semiconductor device 310 includes an encapsulant 312 encapsulating the semiconductor element 320, and the respective outer metal layers 338 of the six insulated substrates 326 are exposed on a same flat surface of the encapsulant 312. It should be noted that at least two of the six lower insulated substrates 326 may be constituted of a single insulated substrate.

Figure 14:
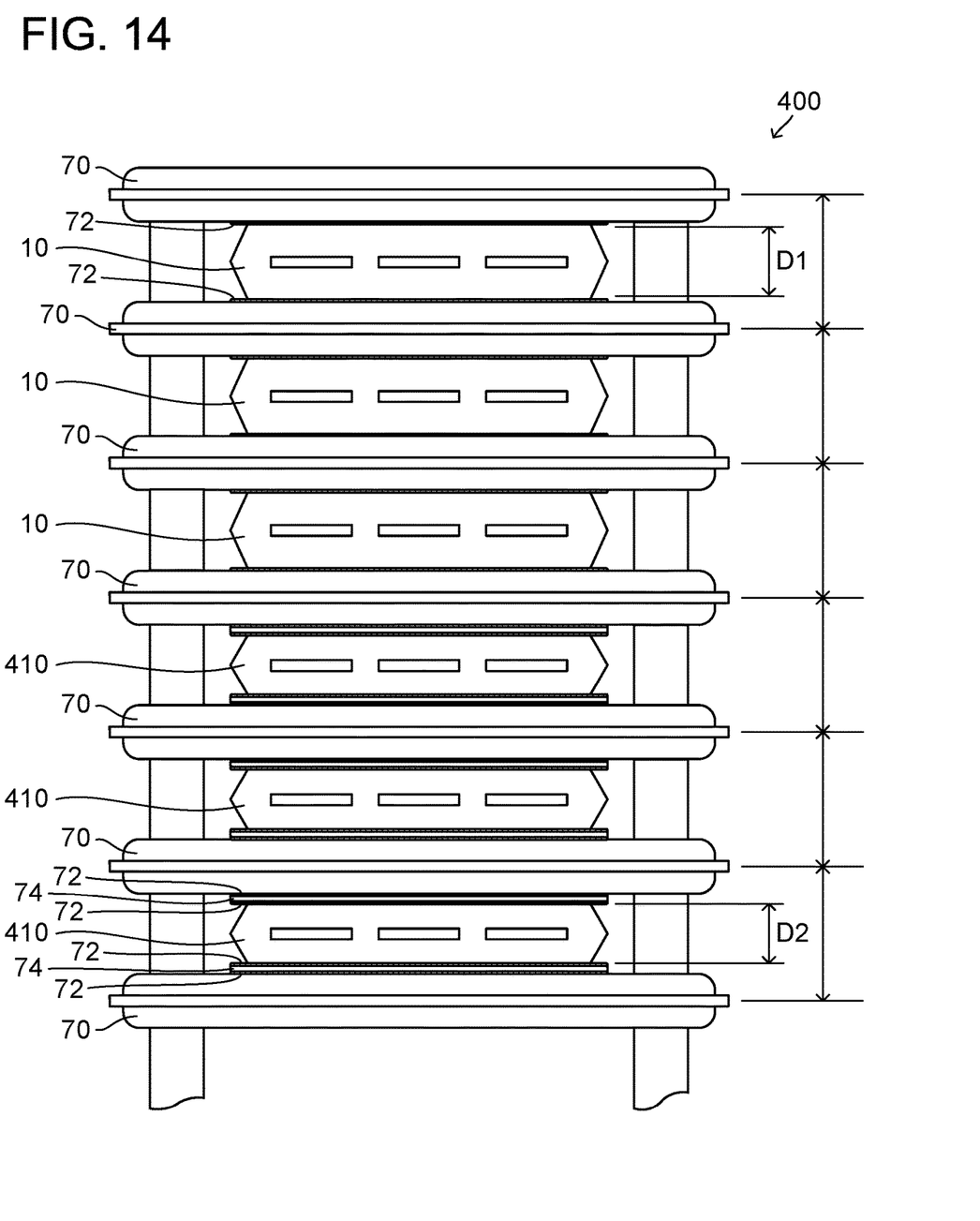
FIG. 14 schematically shows a power unit 400 employing the semiconductor devices 10 in the embodiment.
Figure 15:
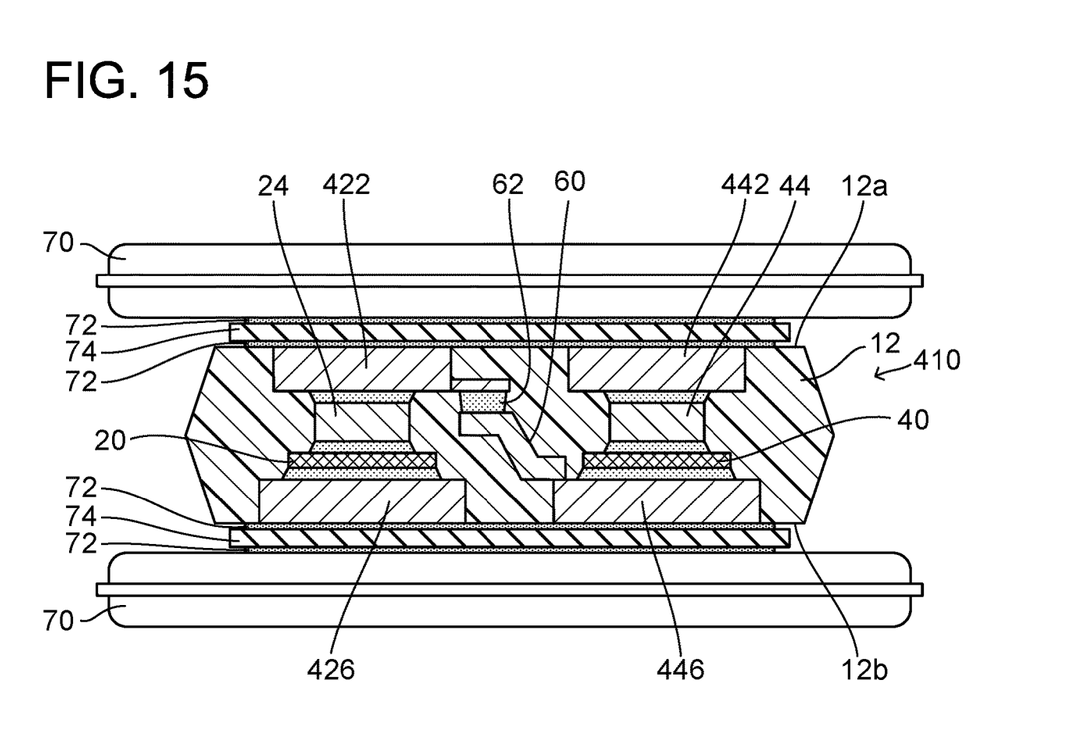
FIG. 15 schematically shows a structure of a second semiconductor device 410 employed in the power unit 400.

Referring to FIGS. 14 and 15, a power unit 400 employing the semiconductor device 10 of the present embodiment will be described below. The power unit 400 includes a plurality of semiconductor devices 10 and 410, and a plurality of coolers 70, and the semiconductor devices 10 and 410, and the coolers 70 are alternately arranged. The plurality of semiconductor devices 10 and 410 includes second semiconductor devices 410 in addition to the semiconductor devices 10 of the present embodiment. As shown in FIG. 15, each second semiconductor device 410 has a structure similar to the structure of the semiconductor device 10 of the present embodiment. However, in the second semiconductor device 410, as compared with the semiconductor device 10 of the present embodiment, four heat sinks 422, 426, 442, and 446 are used in place of the four insulated substrates 22, 26, 42, and 46, respectively. The respective heat sinks 422, 426, 442, and 446 are constituted of conductor, such as copper, and do not include the insulator layers 28, 34, 48, and 54. Thus, an insulator plate 74 is disposed between each of the second semiconductor devices 410 and a corresponding cooler 70, thereby electrically insulating the second semiconductor device 410 and the cooler 70 from one another. Layers of heat dissipation grease 72 are provided on both faces of each of the insulator plates 74.

As mentioned above, in the present embodiment, the insulator plate 74 does not need to be disposed between each of the semiconductor devices 10 and the corresponding cooler 70. Meanwhile, the insulator plate 74 needs to be disposed between each of the second semiconductor devices 410 and the corresponding cooler 70. Thus, if a thickness D1 of the semiconductor devices 10 is substantially same as a thickness D2 of the second semiconductor devices 410 in the present embodiment, it is necessary to change each interval between the plurality of coolers 70 depending on the semiconductor devices 10 and 410 to be disposed. In this case, versatility of the plurality of coolers 70 is reduced. For this reason, in the power unit 400 of the present embodiment, the thickness D2 of the second semiconductor devices 410 is designed to be smaller than the thickness D1 of the semiconductor devices 10, whereby the coolers 70 are arranged at equal intervals. Here, in the power unit 400 of the present embodiment, a wide-bandgap semiconductor, such as silicon carbide, is used for the semiconductor elements 20 and 40 of the semiconductor device 10, while silicon is used for the semiconductor elements 20 and 40 of the second semiconductor device 410. That is, some of the semiconductor devices 10 and 410 employ a wide-bandgap semiconductor, which could generate a relatively significant thermal stress, and also employ a structure incorporating therein the insulator layers 28, 34, 48, and 54 as a countermeasure against the thermal stress.

What is claimed is:

1. A semiconductor device comprising:
   a first insulated substrate comprising an insulator layer and a metal layer disposed on each of two faces of the insulator layer;
   a first semiconductor element disposed on the metal layer on one face of the first insulated substrate;
   a second insulated substrate comprising an insulator layer and a metal layer disposed on each of two faces of the insulator layer;
   a second semiconductor element disposed on the metal layer on one face of the second insulated substrate; and
   an encapsulant encapsulating the first semiconductor element and the second semiconductor element,
   wherein the metal layer on the other face of the first insulated substrate and the metal layer on the other face of the second insulated substrate are exposed on a first flat surface of the encapsulant,
   the semiconductor device, further comprising:
   a third insulated substrate comprising an insulator layer and a metal layer disposed on each of two faces of the insulator layer; and
   a fourth insulated substrate comprising an insulator layer and a metal layer disposed on each of two faces of the insulator layer,
   wherein the third insulated substrate is opposed to the first insulated substrate across the first semiconductor element, the metal layer on one face of the third insulated substrate being electrically connected with the first semiconductor element,
   the fourth insulated substrate is opposed to the second insulated substrate across the second semiconductor element, the metal layer on one face of the fourth insulated substrate being electrically connected with the second semiconductor element, and
   wherein the metal layer on the other face of the third insulated substrate and the metal layer on the other face of the fourth insulated substrate are exposed on a second flat surface of the encapsulant, the second flat surface being located opposite to the first flat surface,
   the semiconductor device, further comprising:
   a first conductive spacer disposed between the first semiconductor element and the third insulated substrate; and
   a second conductive spacer disposed between the second semiconductor element and the fourth insulated substrate;
   wherein each of linear expansion coefficients of the first conductive spacer and the second conductive spacer is smaller than each of linear expansion coefficients of the metal layers of the first insulated substrate and the second insulated substrate and is smaller than a linear expansion coefficient of the encapsulant.

2. The semiconductor device according to claim 1, wherein
   each of materials of the metal layers of the first insulated substrate and the second insulated substrate is copper, and
   each of materials of the first conductive spacer and the second conductive spacer is copper-molybdenum alloy or copper-tungsten alloy.

3. The semiconductor device according to claim 1, wherein the metal layer on the one face is greater in thickness than the metal layer on the other face in at least one of the first insulated substrate and the second insulated substrate.

4. The semiconductor device according to claim 1, wherein the metal layer on the other face is greater in thickness than the metal layer on the one face in at least one of the first insulated substrate and the second insulated substrate.

5. The semiconductor device according to claim 1, wherein the metal layer on the one face is equal in thickness with the metal layer on the other face in at least one of the first insulated substrate and the second insulated substrate.

6. The semiconductor device according to claim 1, at least one of the first insulated substrate and the second insulated substrate is a DBC (Direct Bonded Copper) substrate.

* * * * *